Figure 1:
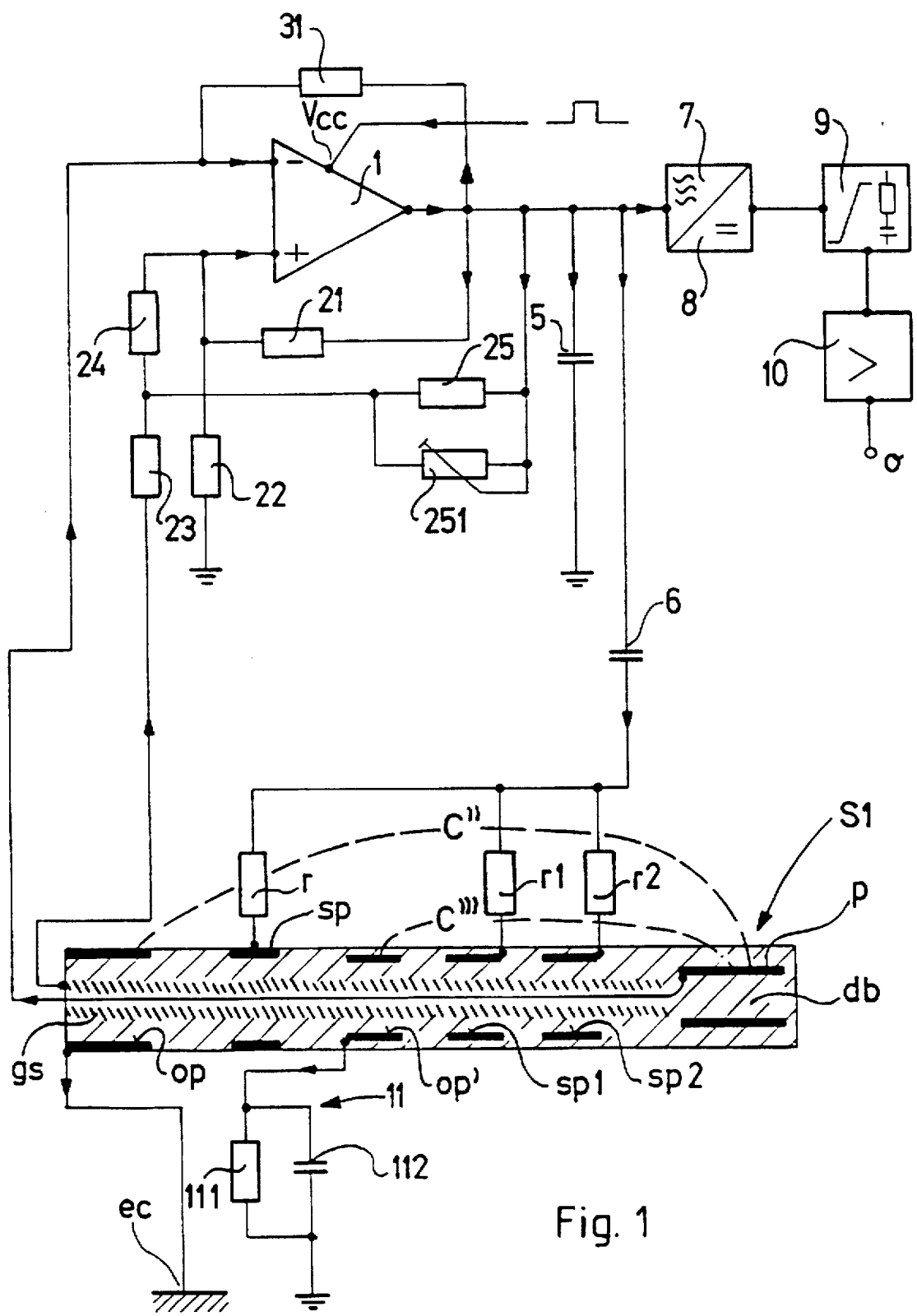

United States Patent [19]

Zatler et al.

[11] Patent Number: 5,739,598

[45] Date of Patent: Apr. 14, 1998

[54] SELFADJUSTING CAPACITIVE LEVEL SWITCH FOR A NON-CONTACT OR CONTACT SENSING OF MEDIA OR OBJECTS

[76] Inventors: Andrej Zatler, Aškerčeva 24, Maribor, Slovenia, 62000; Franc Eferl, Pri šoli 45, Kamnica, Slovenia, 62351

[21] Appl. No.: 596,115

[22] PCT Filed: Jul. 25, 1994

[86] PCT No.: PCT/SI94/00013

§ 371 Date: Jan. 30, 1996

§ 102(e) Date: Jan. 30, 1996

[87] PCT Pub. No.: WO95/04261

PCT Pub. Date: Feb. 9, 1995

[30] Foreign Application Priority Data

Jul. 30, 1993 [SI] Slovenia .............. P 9300405
Nov. 10, 1993 [SI] Slovenia .............. P 9300585

[51] Int. Cl.$^6$ .............................................. H03K 17/945
[52] U.S. Cl. .................................. 307/652; 307/517
[58] Field of Search ........................ 327/517, 187, 327/564, 565; 307/650, 652; 340/562

[56] References Cited

U.S. PATENT DOCUMENTS

| 4,001,613 | 1/1977 | Hills et al. | 327/187 |
| 4,663,542 | 5/1987 | Buck et al. | 307/652 |
| 5,166,679 | 11/1992 | Vranish et al. | 340/870.37 |
| 5,287,086 | 2/1994 | Gibb | 340/618 |
| 5,532,527 | 7/1996 | Zatler et al. | 307/118 |

FOREIGN PATENT DOCUMENTS

| 3 837 993 | 11/1993 | Australia. | |
| 0 441 381 | 8/1991 | European Pat. Off. | G08B 13/26 |
| 0 568 973 | 11/1993 | European Pat. Off. | G01F 23/26 |

*Primary Examiner*—Toan Tran
*Attorney, Agent, or Firm*—Jacobson, Price, Holman & Stern, PLLC

[57] ABSTRACT

Selfadjusting capacitive level switch for a non-contact or contact sensing of media or objects comprising a sensor (S6), on a dielectric body (db) of which between an opposite plate (op) and a plate (p) a screening plate (sp) is mounted. Starting from the plate (p) there are alternately mounted additional screening plates ($sp_1, \ldots, sp_{n+1}$) connected through a resistor (r1) to the screening plate (sp) and additional plates ($p_1, \ldots, p_n$). Groups of additional plates ($p_1, \ldots, p_{n+1}$) are connected through resistors to the inverting input of an operational amplifier (1). At the beginning of each oscillation halfperiod the potential of the plates ($p, p_1, \ldots, p_n$) has a phase opposite to the phase of the screening plates ($sp, sp_1, \ldots, sp_{n+1}$). The level switch detects electrically very poorly conductive materials with the relative permittivity near to 1 even through a thick, electrically well conductive deposit on its sensor.

23 Claims, 10 Drawing Sheets

SELFADJUSTING CAPACITIVE LEVEL SWITCH FOR A NON-CONTACT OR CONTACT SENSING OF MEDIA OR OBJECTS

The invention concerns a selfadjusting capacitive level switch for a non-contact or contact sensing of media or objects also in the case when a layer of electrically conductive material sticks to a sensor belonging to the switch and it also concerns a selfadjusting capacitive level switch, which is turned on or off when the medium surface level varies, always within a narrow interval of medium surface levels, regardless of a possibly present electrically conductive layer sticking to the level switch sensor.

Level switches of this kind are applicable to detect whether the surface level of the medium in a vessel has reached the sensor. The vessels may be silos, storage tanks or reservoirs, which may be open or closed, exposed to atmospheric pressure, to a variable or a steady pressure. Materials contained therein, however, may be quite diverse: liquid, granular or powdery materials of different density, viscosity and adherence, pure or mixed with rigid particles of different size, with air bubbles, with a surface foam, homogeneous or inhomogeneous, with steady or variable electric properties.

The medium surface level sensing is based on different principles. There are known mechanical, electromechanical and hydrostatic level switches, ultrasonic level switches, capacitive and conductive level switches, microwave level switches, optical and radiometric level switches.

Owing to a float or a vibrating member, mechanical and electromechanical level switches are very sensitive to material being deposited thereon and to turbulences in liquid media.

Capacitive level switches are more universal. The capacitance of the measuring capacitor within a sensor varies according to the surface level displacement of the material contained in a tank since the relative permittivity value of the material differs from 1.

There has been known a capacitive level switch VEGA FTC 968 which has been described already in the prior art section of the patent SI-92 00 073.

There are also known non-contact (proximity) capacitive level switches which detect a body approaching to the level switch sensor. Between capacitor plates an electric field sensitive to any permittivity change within its range is created by an oscillator. Non-contact capacitive level switches are very sensitive to moisture and to a contamination of the sensor plates, which have to be maintained and cleaned regularly.

Inductive non-contact level switches are not sensitive to contamination, however, they sense just metal objects. Therefore in silos or storage tanks containing loose and powdery material capacitive level switches cannot be replaced by inductive noncontact level switches when the former fail due to moisture condensing on their sensor, due to the sensor being spattered or due to an electrically conductive layer sticking to the sensor.

It is well known that the turning on and turning off of the level switch within a narrow interval of material surface levels can also be achieved by vibrational level switches "Soliphant" and "Liquiphant" of the firm Endress & Hauser for powdery or granular and liquid materials, respectively. As soon as the level switch sensor consisting of a tuning-fork excited by a piezoelectric crystal is touched by a material, the damping of the tuning-fork is changed and a relay indicating the presence of the material is turned on.

The mentioned level switches, however, are very sensitive to deposits gathering on their sensor. Moreover, when using the first mentioned level switch, the range of grain sizes should not exceed a half-distance between the tuning-fork prongs and when using the second mentioned level switch, the liquid should not contain any solid inclusions.

The solution as proposed by the invention is closest resembled by the third embodiment of a selfadjusting capacitive level switch which is disclosed in the patent SI-92 00 073 of the present applicants and in numerous patent applications originating therefrom, e.g. EP-A-0 568 973 representing a prior right. This selfadjusting capacitive level switch comprises a sensor, in the dielectric body of which at the first end a first electrically conductive plate is mounted and at the second end a second electrically conductive plate acting as the opposing plate of the sensing capacitance is mounted. On the dielectric body between both plates an electrically conductive screening plate is mounted. The output of an operational amplifier is earthed through a capacitor and is connected through an output signal-shaping circuit to the output of the level switch. The operational amplifier, the inverting input of which is connected to the first electrically conductive plate, and the output of which is connected through a capacitor to the electrically conductive screening plate, is a component of an astable multivibrator operating as an electronic oscillator, which detects electrically conductive as well as electrically nonconductive liquids, powdery and granular materials and which does not have to be adjusted to various materials. Just because of a mutual phase opposition, at least at the beginning of each half-cycle, of a potential at the first electrically conductive plate and of a potential at the electrically conductive screening plate; the described level switch is able to detect a material surface level changing around the level of its sensor although a thick deposit of the controlled material has remained thereon, which can have a wide range of electrical properties. Due to the emphasized influence of the electrically conductive screening plate, however, this level switch fails when a thick layer of electrically very well conductive material sticks to the sensor, whereas the controlled medium has a very low electrical conductive and relative permittivity $\epsilon$ near to 1. These inconvenient circumstances appear in the following case. First, the level switch should control an electrically very well conductive material which, however, after the material surface has dropped, sticks to the sensor by forming a thick deposit, whereafter an electrically poorly conductive material with the relative permittivity $\epsilon \approx 1$ should be controlled. A thick deposit of an electrically well conductive material would allow the level control of the surface of an electrically well conductive material, however, the sensor does not detect slight variations of the electric field surrounding it, which are caused by variations of the surface level of the electrically poorly conductive medium with the relative permittivity $\epsilon \approx 1$.

Consequently, the technical problem to be solved by the present invention is how to improve a self-adjusting capacitive level switch so that its sensor, even if a thick layer of electrically well conductive material has accumulated thereon will sense approaching media or objects in a non-contact or contact way regardless of their electrical conductivity and relative permittivity.

At the first embodiment of the self-adjusting capacitive level switch according to the invention for a non-contact or contact sensing of media or objects this is accomplished in that in a dielectric body, starting from a first electrically conductive screening plate and distant from each other in the direction from said first screening plate towards a first electrically conductive plate of a sensing capacitance, a third electrically conductive plate acting as an additional opposing plate of the sensing capacitance and additional electrically conductive screening plates are mounted and that the third electrically conductive plate acting as an opposing plate is connected through a first RC-filter to the earth of the level switch and that a second electrically conductive plate acting as opposing plate of the sensing capacitance is connected to the electrical network earth and that the output of an operational amplifier is connected through a second capacitor to the common terminal of the first, second and further resistors provided for shaping the electric field around the sensor and the second terminal of the first resistor for shaping the electric field is connected to the first electrically conductive screening plate and the second terminal of the second, third and further resistors for shaping the electric field is connected to the additional electrically conductive screening plates.

The advantage of the first embodiment of the self-adjusting capacitive level switch according to the invention for a non-contact or contact sensing of media or objects is marked against known capacitive, e.g. level, switches for contact sensing, since it is able to sense electrically very poorly conductive materials with the relative permittivity near to 1 through a thick, electrically well conductive deposit on its sensor, as well as against known capacitive switches for non-contact sensing since in the set operating point it operates normally regardless of any contamination which accumulates on its sensor during operation.

A solution to the technical problem is further given by the second embodiment of the self-adjusting capacitive level switch according to the invention wherein within a dielectric body of the sensor at its end distant from a vessel wall an additional electrically conductive screening plate is mounted, which is connected through a resistor to a first electrically conductive screening plate.

And finally, a solution to the technical problem is given by the third embodiment of the selfadjusting capacitive level switch according to the invention, wherein within a dielectric body of its sensor, starting from a first electrically conductive plate and distant from each other in the direction from the first electrically conductive plate towards the dielectric body end distant from a vessel wall, there are alternately mounted additional electrically conductive screening plates and additional electrically conductive plates and at the very end of the dielectric body the plate of said additional electrically conductive screening plates is mounted. The first electrically conductive plate and several additional electrically conductive plates adjacent to each other are connected to each other in groups and these plate groups are through resistors that are provided for determining the effect which the relevant plate group exerts on the rate of changing the voltage on the inverting input of an operational amplifier, connected to its inverting input. All additional electrically conductive screening plates are interconnected and connected through a first resistor to the first electrically conductive screening plate.

The advantage of the self-adjusting capacitive level switch according to the invention in its second and third embodiment exists in that it turns on/off within a narrow surface level interval not varying from one practically occuring controlled medium to another, which media are naturally quite diverse as regards their electrical properties.

The self-adjusting capacitive level switch according to the invention in any of its embodiments always switches without hysteresis, thus it turns on or turns off at practically the same surface level of the controlled medium. An automatic checking of the operation of the entire capacitive level switch circuit is simply performed in a self-acting manner.

Figure 2:
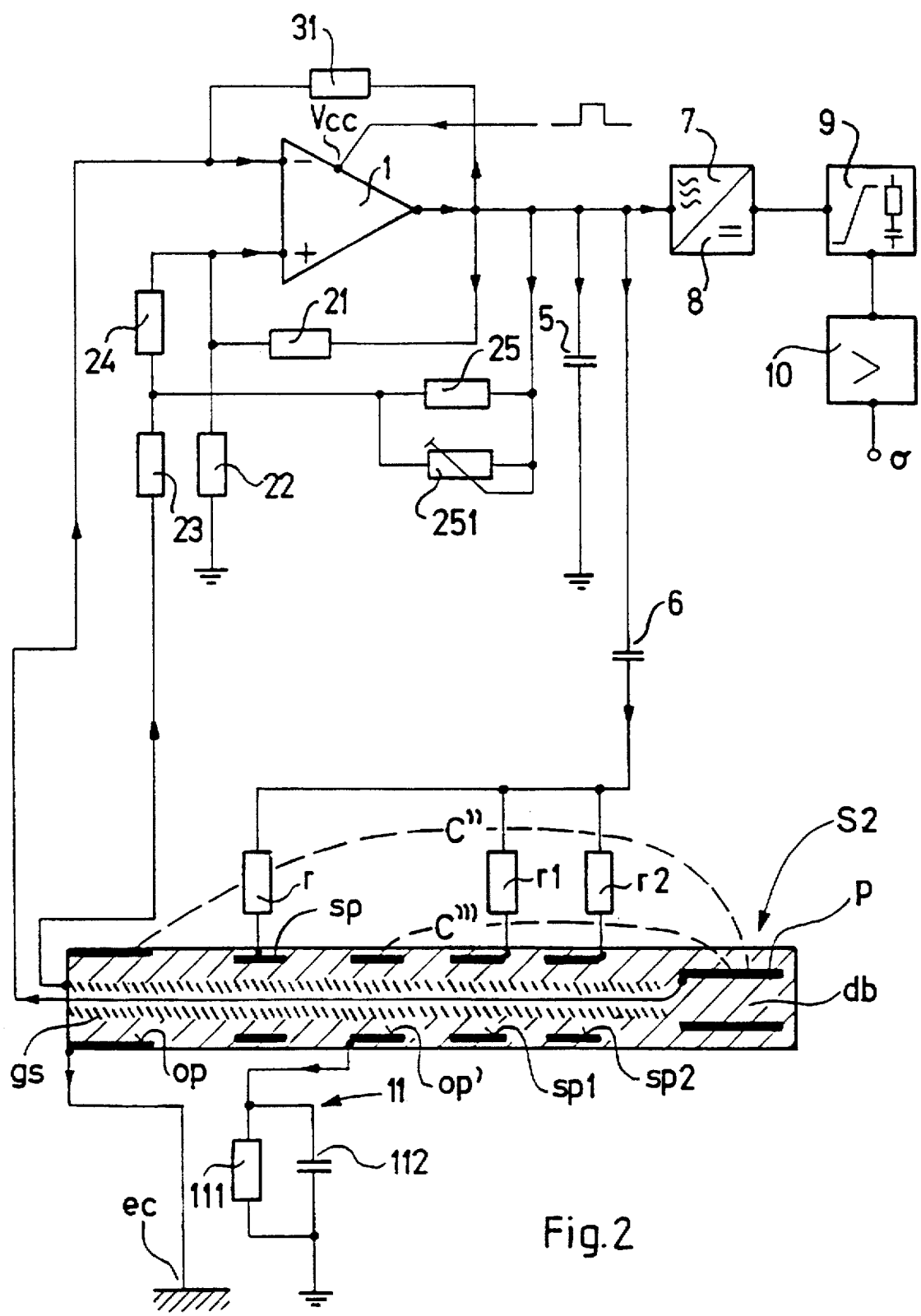
Figure 3:
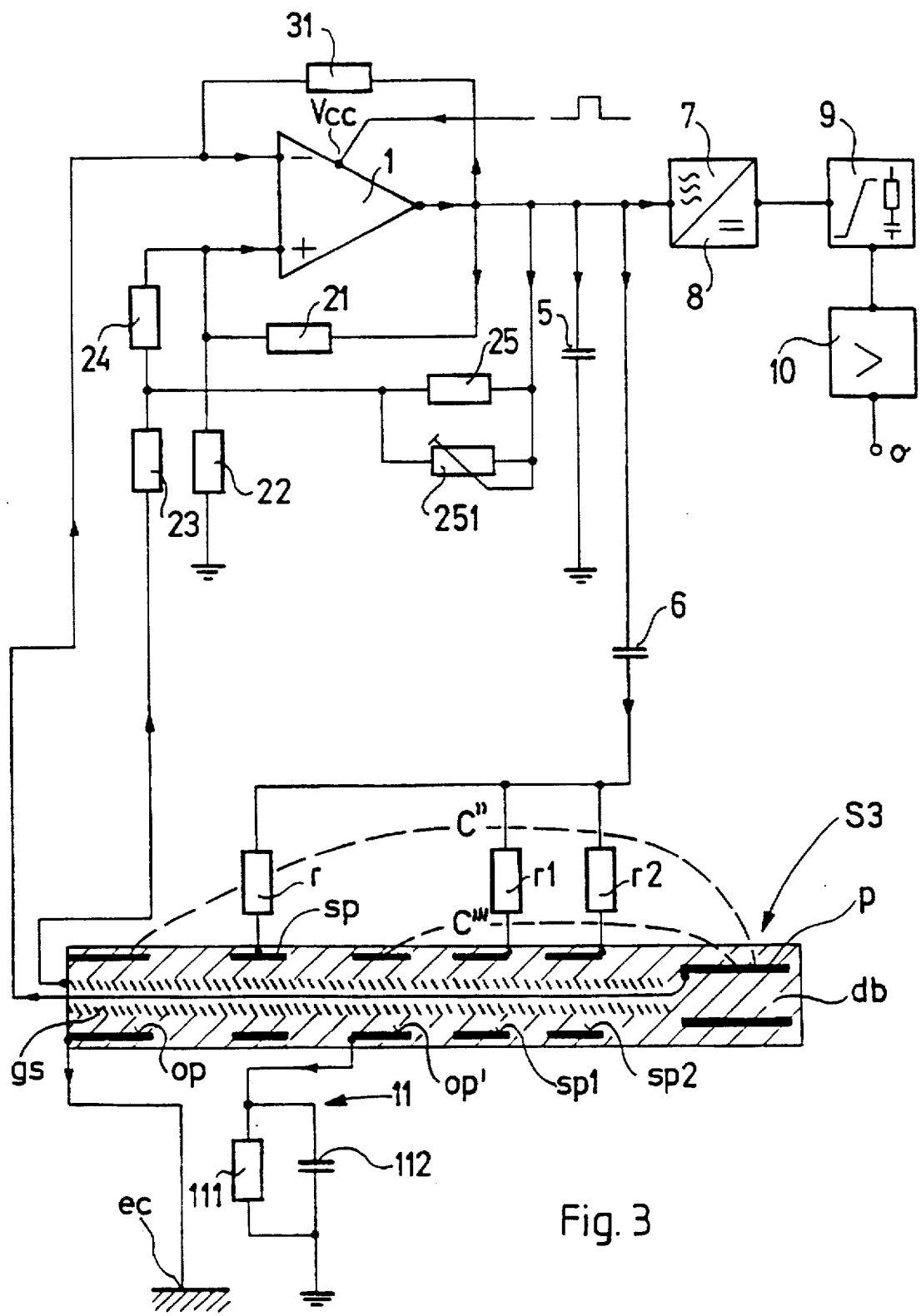
Figure 4:
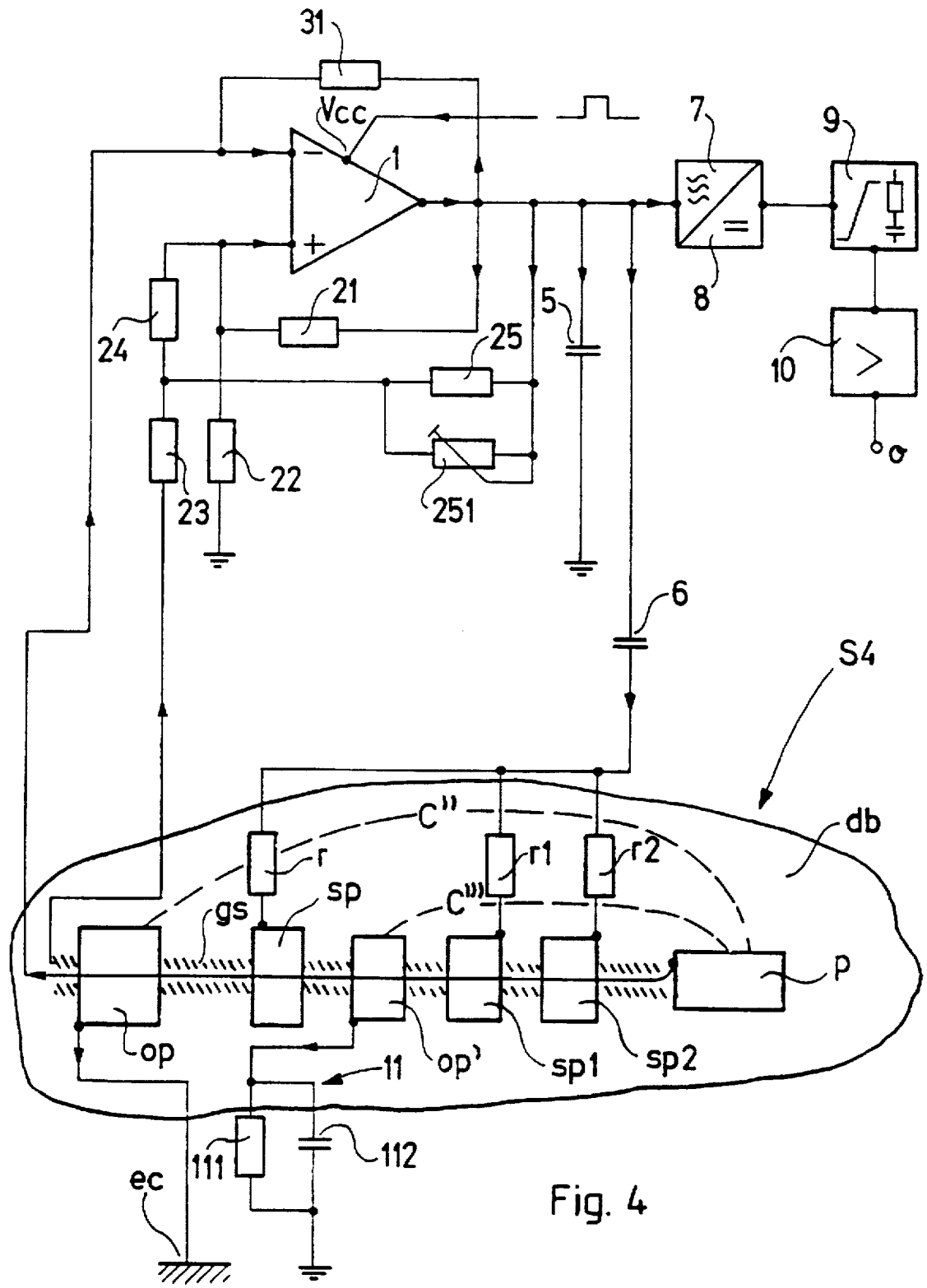
Figure 5:
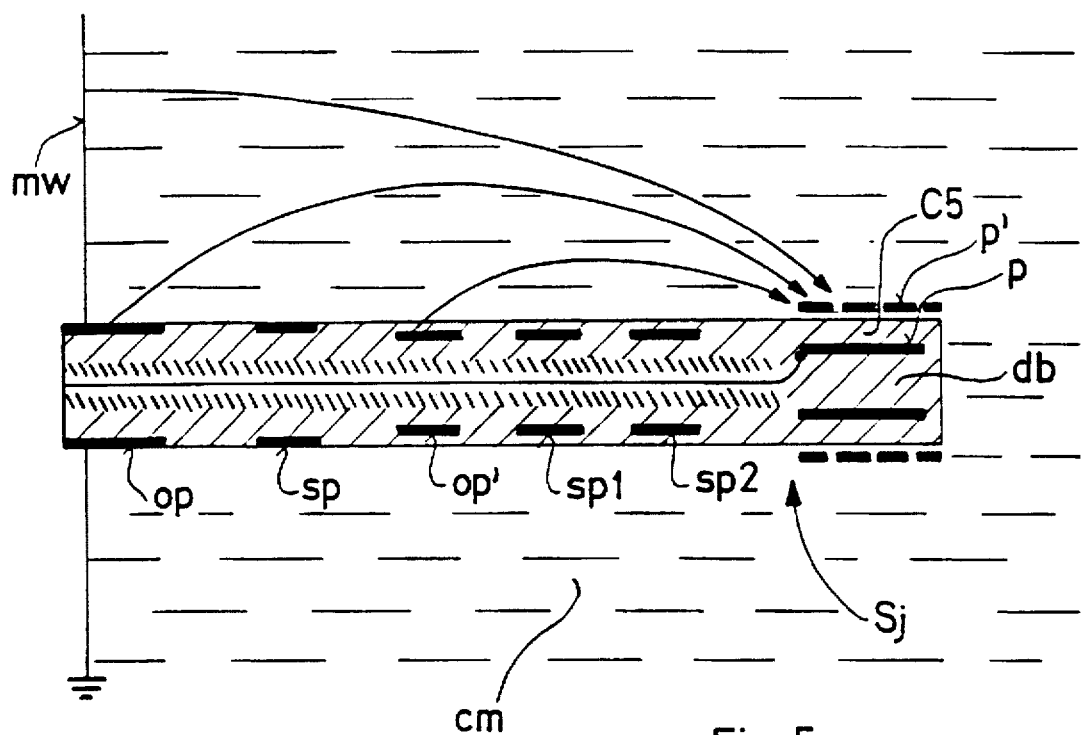
Figure 6:
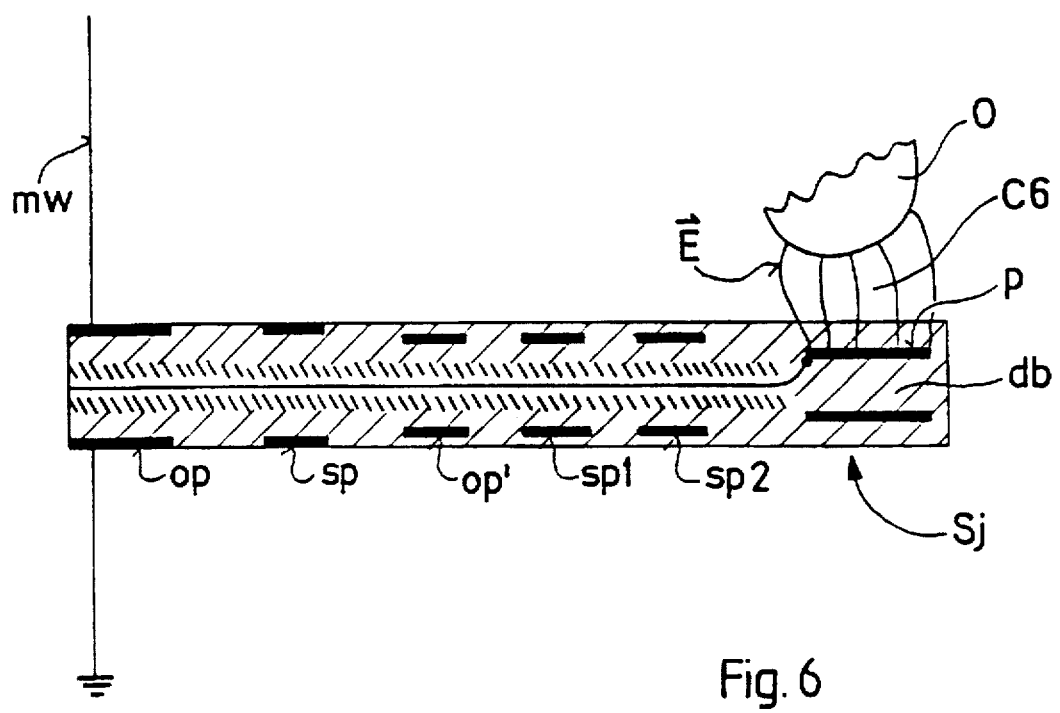
Figure 7:
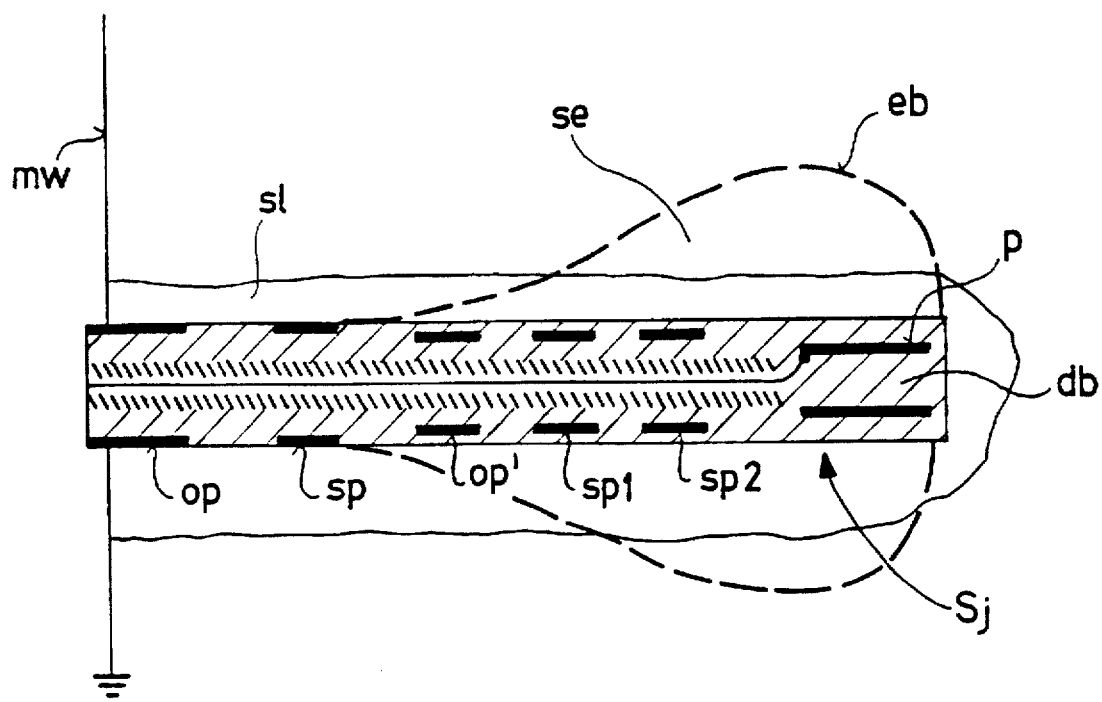
Figure 8:
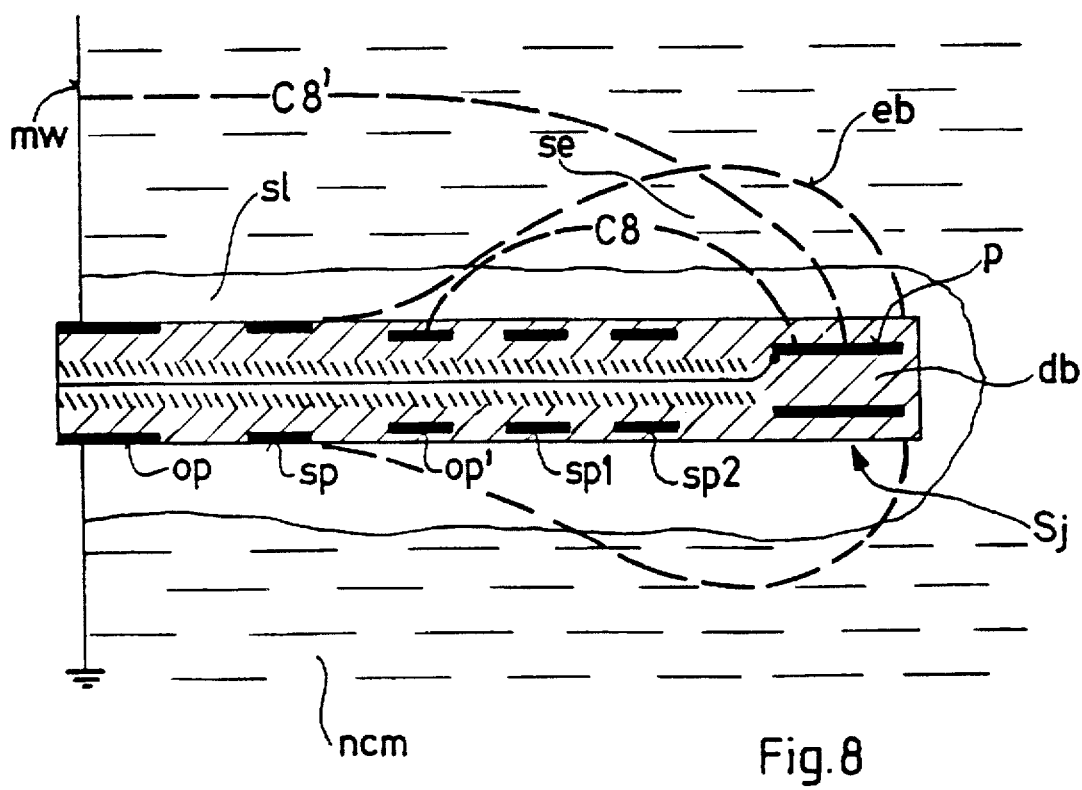
Figure 9:
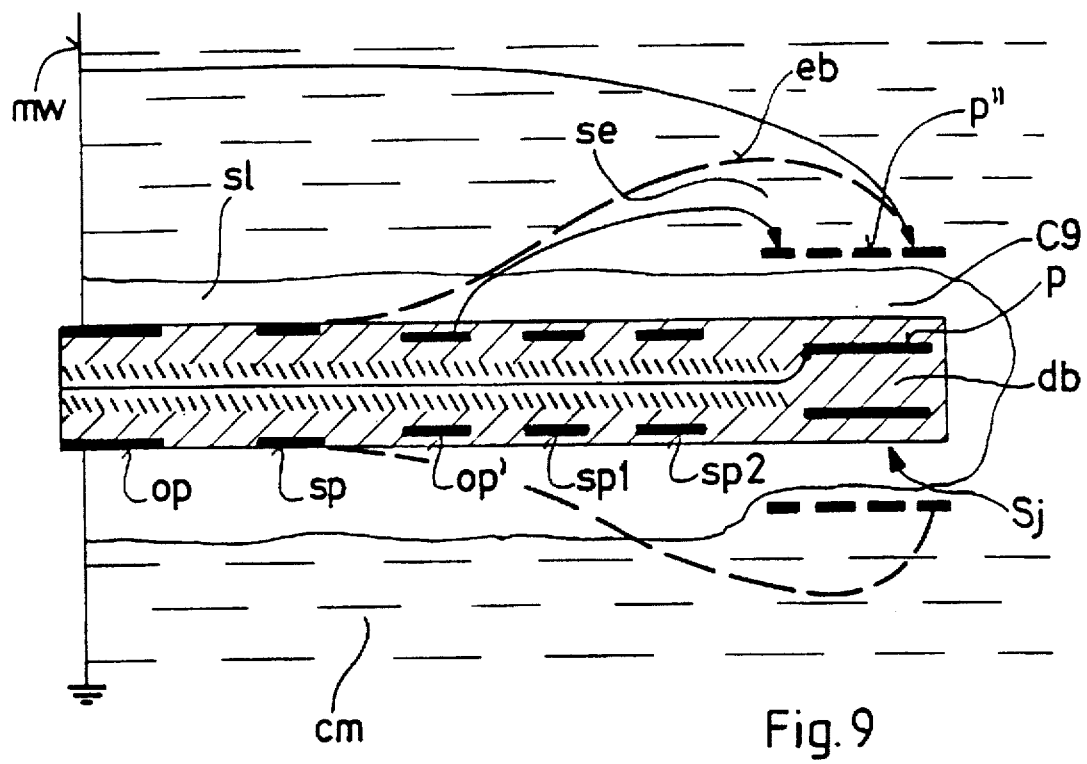
Figure 10:
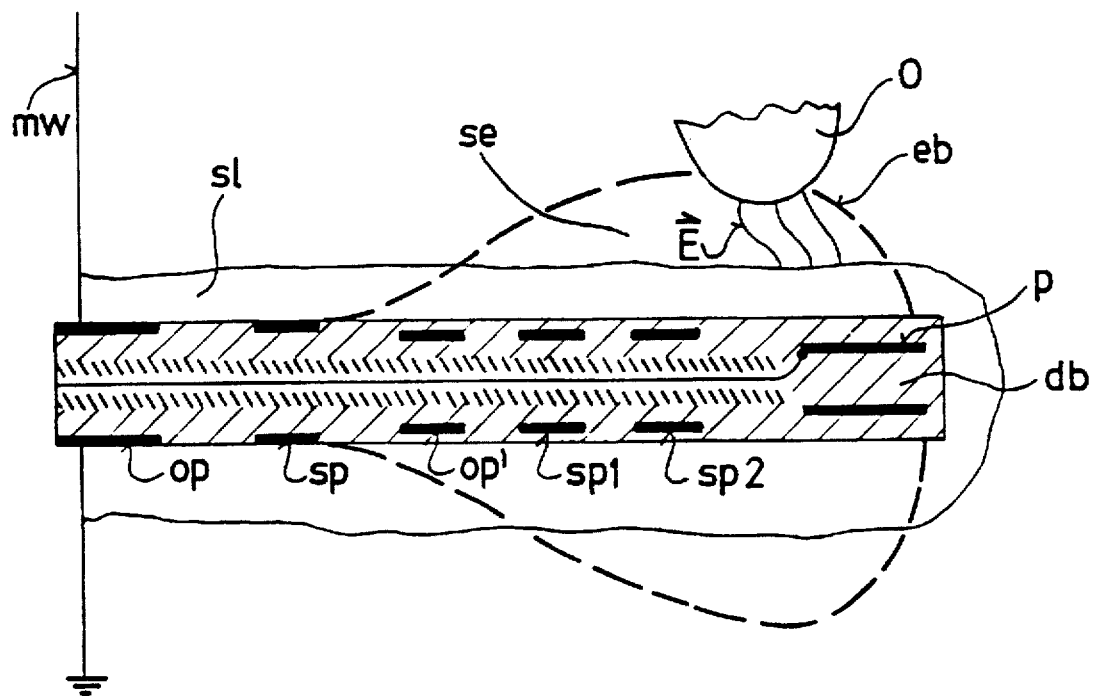
Figure 11:
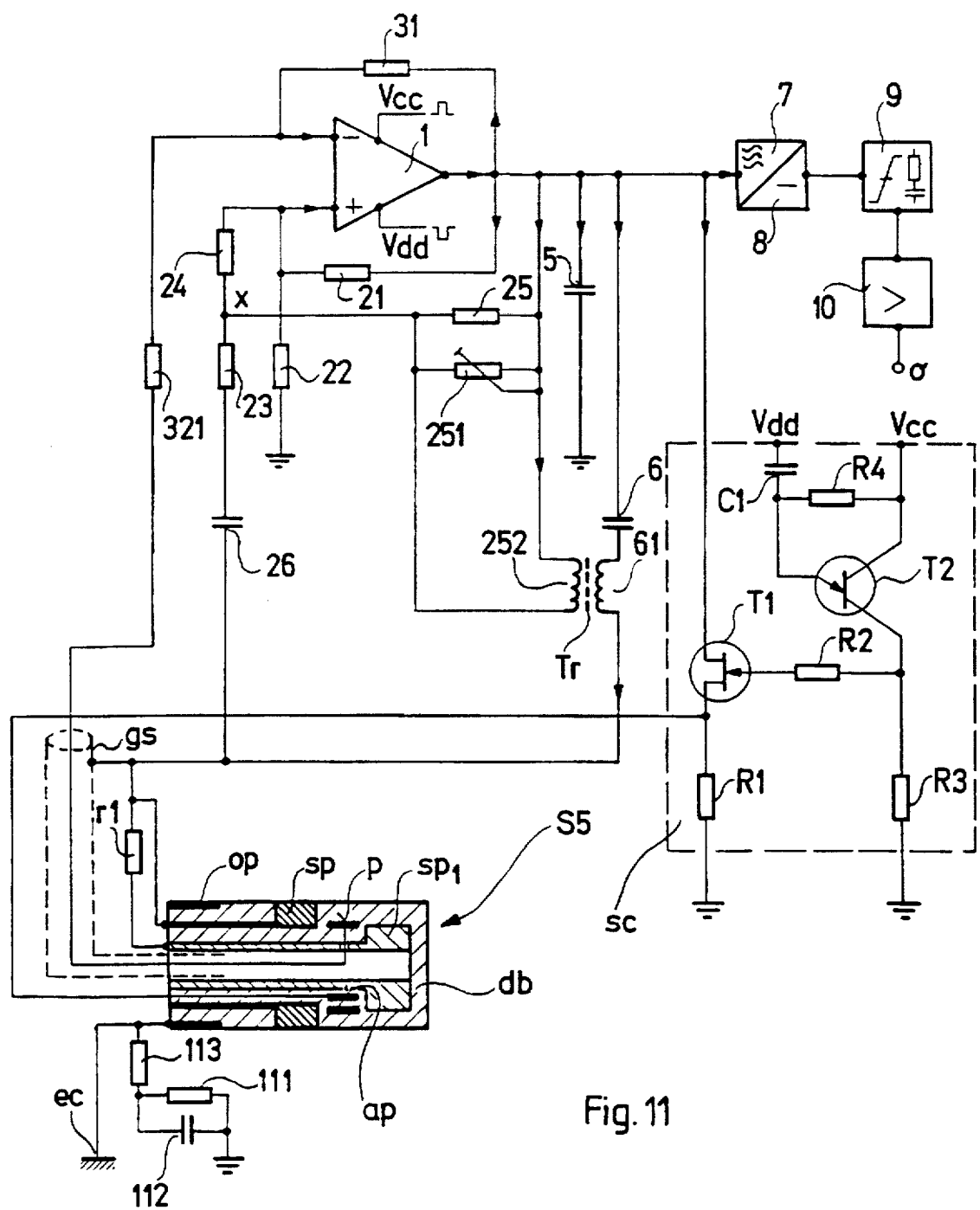
Figure 12:
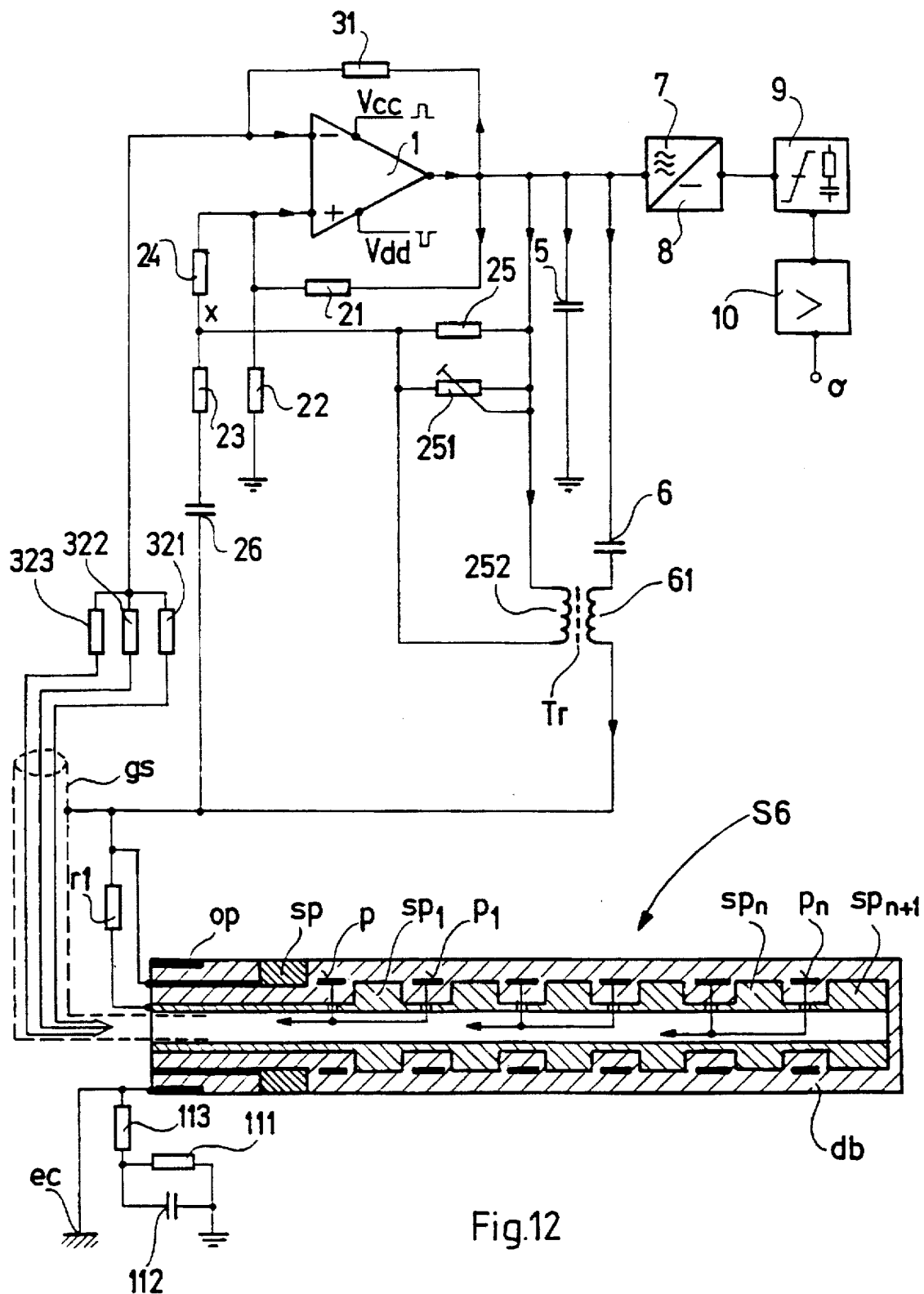

The invention will now be described by way of examples and with reference to the accompanying drawings representing in:

FIGS. 1 to 3 the first three variants of the first embodiment of the self-adjusting capacitive level switch according to the invention for a non-contact or contact sensing of media or objects, FIG. 4 the fourth variant of the first embodiment of the self-adjusting capacitive level switch according to the invention for a non-contact or contact sensing of media or objects, FIG. 5 an uncoated sensor of the first embodiment of the level switch according to the invention in an electrically conductive medium, FIG. 6 an uncoated sensor of the first embodiment of the level switch according to the invention with an object nearby, FIG. 7 a space of effectiveness of a coated sensor of the first embodiment of the level switch according to the invention, FIG. 8 a space of effectiveness of a coated sensor of the first embodiment of the level switch according to the invention in an electrically nonconductive medium, FIG. 9 a space of effectiveness of a coated sensor of the first embodiment of the level switch according to the invention within an electrically conductive medium, FIG. 10 a coated sensor of the first embodiment of the level switch according to the invention with an object nearby, FIGS. 11 and 12 the second and third embodiment, respectively, of the selfadjusting capacitive level switch according to the invention.

Figure 13:
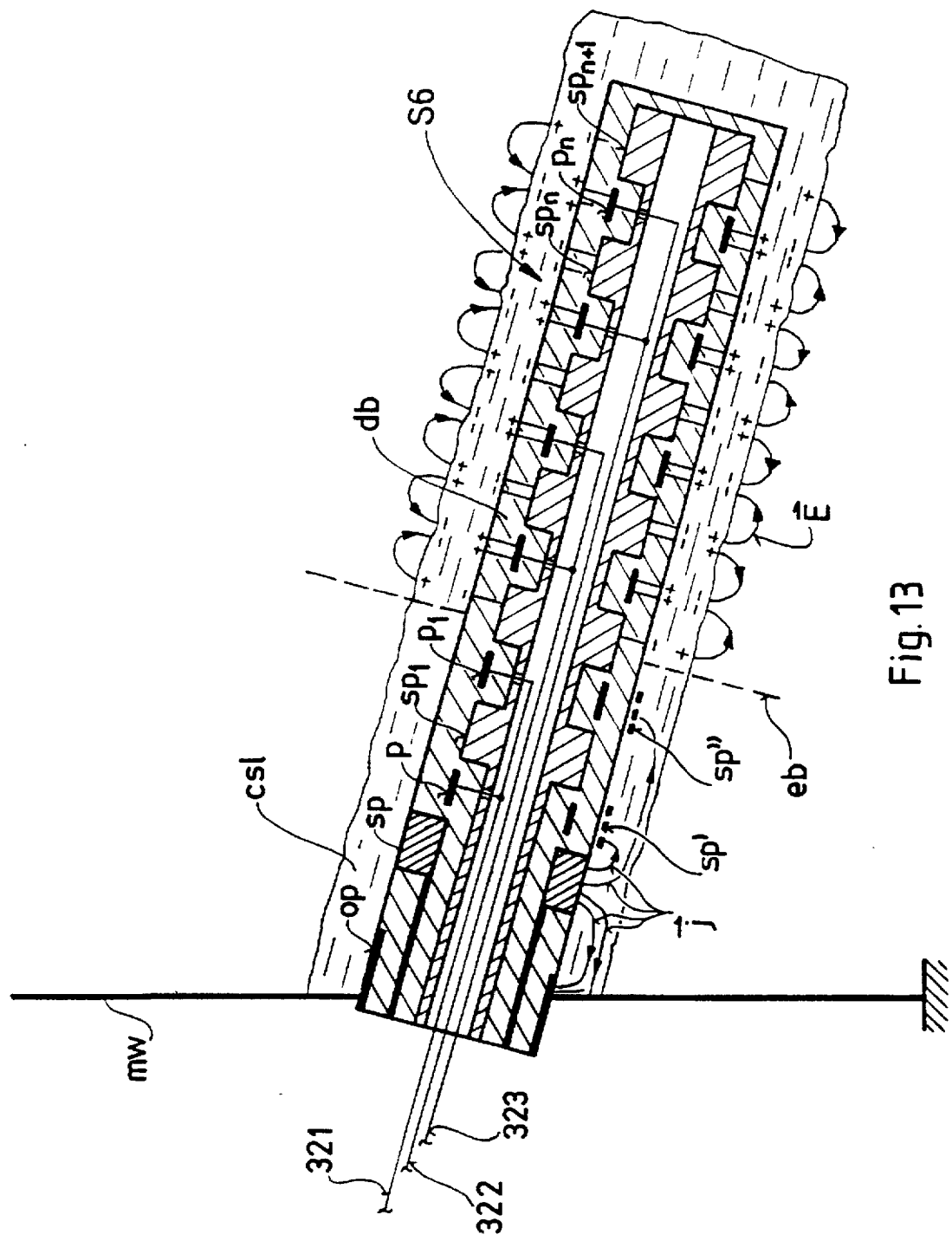

FIG. 13 the electrical situation round a sensor which is coated with a layer of electrically conductive medium in the third embodiment of the selfadjusting capacitive level switch according to the invention.

In all variants of the first embodiment a selfadjusting capacitive level switch according to the invention for a non-contact or contact sensing of media or objects is represented by a sensor Sj (j=1 to 4) and by a relevant circuit (FIGS. 1, 2, 3, 4); to the output o of this circuit a relay or/and an alarm system (not shown) are connected.

The sensor Sj is always made of a dielectric body db. In the dielectric body db of the sensor Sj at its free end, i.e. the end distant from the mounting wall of a vessel, an electrically conductive plate p is inserted. The plate p is connected to the inverting input of an operational amplifier 1 by a lead which is enclosed in a guard shield gs which is at a potential being in phase with the potential at the output of the operational amplifier 1. The plate p is thus separated by a layer of a dielectric from the medium in the vessel or from air surrounding the sensor Sj. The dielectric body db is further equipped with an electrically conductive opposite plate op, which is placed at the dielectric body end provided for mounting on the vessel wall and is connected to the electrical network ground ec. Actually, however, in a preferred variant of the embodiment the opposite plate op is connected through the first RC-filter 11 to the level switch mass only in highly conductive media to prevent a deformation of the oscillation amplitude.

In all variants of the first embodiment of the selfadjusting capacitive level switch according to the invention the operational amplifier 1, which at the input Vcc is energized intermittently with a frequency of the order of magnitude of 0.1 Hz to 100 Hz, is provided with a positive and negative feedback, the feedbacks being accomplished by resistances 21, 22; 25, 251, 24 and by the resistor 31, respectively, and together with the sensor Sj it constitutes an oscillator. The oscillator frequency depends on the physical situation round the sensor Sj, the oscillator output voltage being constant and in a preferred manner being chosen to be the saturation voltage of the applied operational amplifier 1. The output of the operational amplifier 1 is connected to the input of a switching signal-shaping circuit, whose output is also the output o of the level switch. The switching signal-shaping circuit consists of a low-frequency band filter 7, a rectifier 8, an amplitude limiter 9 being essentially composed of a Zener-diode and a capacitor, and of an amplifier 10, all components connected in series.

In the circuit of the first embodiment of the selfadjusting level switch of the invention, the inverting input of the operational amplifier 1 with positive and negative feedback accomplished by the resistor 21 and the resistor 31, respectively, is connected to the plate p of the sensor Sj and the non-inverting input of the operational amplifier 1 is connected through the resistors 23, 24, connected in series, to the guard shield gs, which encloses the lead to the plate p. The output of the operational amplifier 1 is connected to the common terminal of the resistors 23, 24 through the resistor 25 shunted by the adjustable resistor 251. The grounded resistor 22 is connected to the non-inverting input of the operational amplifier 1, the output of which is grounded through the first capacitor 5.

By the adjustable resistor 251 the level switches provided with the sensor Sj of different size and form are adjusted to the same sensitivity of response irrespective of being used as contact or non-contact level switches. On the sensor Sj between the electrically conductive plate p and the electrically conductive opposite plate op an electrically conductive screening plate sp is mounted. The screening plate sp plays an important role which, however, was disclosed in detail already in the patent SI-92 00 073. Furthermore, in the dielectric body db, starting from the screening plate sp and distant from each other in the direction from the screening plate sp towards the plate p, an electrically conductive additional opposite plate op' and one or several electrically conductive additional screening plates sp1, sp2, . . . are mounted, their number being determined with regard to the construction of the sensor Sj and to the requirements on how to form the electric field round the sensor Sj. The form and the size of the plates op, sp, op', sp1, sp2, . . . and p depend just on the form and size of the dielectric body db.

The additional opposite plate op' is also connected through the first RC-filter 11 consisting of a resistor 111 and a capacitor 112, connected paralelly to each other, to level switch mass and, in the practice, to the vessel containing stored medium, respectively. In a special variant of the embodiment the additional opposite plate op' is connected to the opposite plate op. The output of the operational amplifier 1 is connected through the second capacitor 6 to the common terminal of the first, second and further resistors r, r1, . . . provided for shaping the electric field around the sensor Sj, and the second terminal of the first resistor r is connected to the screening plate sp and the second terminal of the second, third and further resistors r1, r2, . . . is connected to the additional screening plates sp1, sp2, . . . , respectively. The resistance of the resistors r1, r2, . . . grows as the index grows, the resistance of the resistor r1 being very small.

In the sensor S1 the opposite plate op and the screening plate sp are mounted on the surface of the dielectric body db (FIG. 1). In the sensor S2 the opposite plate op is mounted on the surface of the dielectric body db and the screening plate sp is mounted within the dielectric body db (FIG. 2).

In the sensor S3 the opposite plate op and the screening plate sp are mounted within the dielectric body db (FIG. 3).

In a preferred variant the dielectric body db of the first, second or third sensor S1; S2; S3 is a prismatic body and the opposite plate op, the screening plate sp, the additional opposite plate op', the additional screening plates sp1, sp2, . . . and the plate p are annularly formed. However, the sensors S1; S2; S3 may also be formed differently and the plates may also be placed on the sensor front side. It is only important that the order of the plates remains the same. Thus, in FIG. 4 the sensor S4 is represented, the dielectric body db of which is a flexible insulating foil and the opposite plate op, the screening plate sp, the additional opposite plate op', the additional screening plates sp1, sp2, . . . and the plate p are electrically conductive foils, e.g. self-adhesive ones, fastened thereon. Those of the plates op, sp, op', sp1, sp2, . . . , p, which are meant to be separated from the controlled medium by a dielectric layer, are obviously fastened to the sensor side which is turned away from the medium or the whole sensor S4 is fastened on the outer side of the electrically nonconductive vessel wall. The sensor S4 is mounted so that the plate p is oriented towards the surface of the approaching medium.

In the sensors S1; S2; S3; S4 an electrically conductive auxiliary plate is mounted near the plate p and, by a switching circuit sc (FIG. 11) with a frequency in the order of magnitude of 1 Hz for a time interval of 1 ms, it is alternately connected to the output of the operational amplifier 1 and to level switch mass.

The selfadjusting capacitive level switch of the invention for a non-contact or contact sensing of media or objects functions as follows.

When the sensor Sj of the selfadjusting capacitive level switch of the invention is dipped into an electrically conductive medium cm, the grounded metal wall mw of the vessel, the opposite plate op (capacitance C" with respect to the plate p, FIGS. 1 to 4) and the additional opposite plate op' (capacitance C''' with respect to the plate p, FIGS. 1 to 4) are represented by an apparent plate p' which close to the dielectric body db, encloses the plate p (FIG. 5). A high capacitance C5 of the apparent capacitor with plates p, p' makes possible that an oscillator, which in addition to the sensor Sj also consists of the operational amplifier 1 together with the pertinent elements, starts to oscillate.

The oscillator in the level switch circuit also starts to oscillate when the sensor Sj is situated in air and an arbitrary object O is moved into its vicinity (FIG. 6). Namely, between the object O and the plate p the electric field E of a capacitor with capacitance C6 is built up.

In situations according to FIGS. 5 and 6 the selfadjusting capacitive level switch of the invention functions like hitherto known contact or non-contact capacitive level switches. Namely, the effect of the screening plate sp, the additional screening plates sp1, sp2, . . . , and the additional opposite plate p' is negligible.

In the following the functioning of the selfadjusting capacitive level switch of the invention in situation of an electrically well conductive material will be described, especially when on the sensor Sj of the level switch for contact sensing a thick and electrically highly conductive surface layer sl accumulates or in the situation of an electrically well conductive surface layer, e.g. a moistened contamination or a surface layer originating from oil emulsions sprayed in a technological process, covering the sensor Sj of the selfadjusting capacitive level switch of the invention for non-contact sensing. When at the level switch for contact sensing provided with such sensor Sj the medium level drops below the level of the sensor Sj, the screening plate sp eliminates the effects of the grounded metal wall mw of the vessel and of the opposite plate op upon the plate p.

The additional opposite plate op' and the additional screening plates sp1, sp2, . . . , however, are necessary in order that the space se of effectiveness of the sensor Sj is not reduced to much or eliminated completely (FIG. 7). The level switch according to the invention provided with such sensor Sj, although coated with the sticking layer sl, is able to control electrically nonconductive media, too. The space se of effectiveness is represented in a schematic way by a dashed effectiveness border eb.

In FIG. 8 the sensor Sj covered by the electrically conductive sticking layer sl has been sunk in an electrically nonconductive medium ncm. The metal wall mw of the vessel exerts a negligible influence on the plate p (capacitance C8'). However, the plate p is mainly influenced by the additional opposite plate op' (capacitance C8) which would move apparently towards the plate p if this was not prevented by the additional screening plates sp1, sp2, . . . The additional opposite plate op' weakens the effect of the screening plate sp on the extent of the space se of effectiveness round the plate p. The effect of the screening plate sp is adjusted by the resistor r with respect to the surface area of the plate p and the size of the sensor Sj.

The effect of the screening plates sp1, sp2, . . . is adjusted by the resistance of the resistors r1, r2, . . . . The number and the surface area of the additional screening plates sp1, sp2, . . . and the resistance of the resistors r1, r2, . . . are determined with respect to the desired extent of the space se of effectiveness at the foreseen maximum thickness of the electrically conductive sticking layer sl on the sensor Sj.

In FIG. 9 the sensor Sj covered by the electrically conductive sticking layer sl has been sunk in an electrically conductive medium cm. The metal wall mw of the vessel and the additional opposite plate op' move to an apparent plate p" enclosing the plate p over the sticking layer sl. A capacitor between the plates p, p" (capacitance C9) makes possible the oscillating of the oscillator.

In FIG. 10 the functioning of the selfadjusting non-contact capacitive level switch of the invention is shown. Near the sensor Sj coated by the electrically conductive sticking layer sl an object O is situated. Between the object O reaching into the space se of effectiveness of the sensor Sj and the plate p an electric field E is built up enabling the oscillator of the level switch of the invention to start oscillating.

The effect of the opposite plate op and/or of the screening plate sp is reduced in an electrically conductive medium if they are mounted in the dielectric body db of the sensor S2 and S3, respectively (FIGS. 2 and 3), whereas the reduction of this effect is negligible at an electrically weakly conductive medium. The sensor S3 in a nongrounded medium functions similarly to the sensor S1 in a grounded medium.

By the preferred intermittent operation of the oscillator it is achieved that the level switch of the invention is able to function at thicker sticking layers sl on the sensor Sj.

The selfadjusting capacitive level switch of the invention functions in the same manner when it is applied as a contact (level) switch or when it is applied as a non-contact (proximity) switch.

Regarding special requirements when applying the selfadjusting capacitive level switch of the invention, preferably the following variant of the first embodiment of the sensor Sj are mounted. For an electrically very well conductive medium the sensor S1 is mounted. The sensor S2 is mounted in the case of a medium building only thin deposits on the sensor S2, however, above all it is used for inflammables and explosive media. In a medium corroding metals the sensor S3 is mounted.

A selfadjusting capacitive level switch according to the invention for a non-contact or contact sensing of media or objects in the second and third embodiment comprises a sensor S5 and S6, respectively, an operational amplifier 1 negatively and positively feedbacked and a circuit for shaping a switching signal at the output o of the level switch (FIGS. 11 and 12). The circuit for shaping a switching signal consists of a low-frequency band filter 7, a rectifier 8, an amplitude limiter 9 being essentially composed of a Zenerdiode and a capacitor, and of an amplifier 10, all components connected in series. The output of the operational amplifier 1 is grounded through the first capacitor 5.

At the first end of a dielectric body db of the sensor S5; S6 in the second and third embodiment, respectively, of the capacitive level switch of the invention an electrically conductive opposite plate op is mounted and in the dielectric body db near to its second end an electrically conductive plate p is mounted and between the electrically conductive plate p and the electrically conductive opposite plate op an electrically conductive screening plate sp is mounted.

In the sensor S5 (FIG. 11) of the second embodiment of the selfadjusting capacitive level switch of the invention, in the dielectric body db at its second end an electrically conductive additional screening plate $sp_1$ is mounted, which is through the first resistor r1 connected to the electrically conductive screening plate sp. The electrically conductive screening plate sp is connected to the positive feedback loop of the operational amplifier 1, as it will be shown below, so that its potential is in-phase with the potential at the output of the operational amplifier 1. The electrically conductive plate p is connected through a resistor 321 to the inverting input of the operational amplifier 1.

In the sensor S6 (FIG. 12) of the third embodiment of the selfadjusting capacitive level switch of the invention, in the dielectric body db, starting from the electrically conductive plate p and distant from each other in the direction from the electrically conductive plate p towards the second end of the dielectric body db, there are mounted alternately electrically conductive additional screening plates $sp_1 \ldots sp_{n+1}$ and electrically conductive additional plates $p_1 \ldots p_n$. At the very end of the dielectric body db an electrically conductive additional screening plate $sp_{n+1}$ is mounted. The electrically conductive additional screening plates $sp_1 \ldots sp_{n+1}$ are interconnected, in a special variant of the embodiment e.g. by a metal tube building them (FIGS. 12, 13). The electrically conductive plate p and several each time to each other adjacent electrically conductive additional plates $p_1, \ldots, p_n$ are connected to each other in groups. Individual groups of interconnected adjacent electrically conductive additional plates p, $p_1 \ldots p_n$ are through resistors 321, 322, 323, provided for determining the effect exerted by the relevant plate group on the rate of changing the voltage on the inverting input of the operational amplifier 1, connected to inverting input of the operational amplifier 1. The electrically conductive additional screening plates $sp_1, \ldots, sp_{n+1}$ are connected through the resistor r1 to the electrically conductive screening plate sp which is connected to the output of the operational amplifier 1 as it will be shown in the following, its potential thus being essentially in-phase with the potential at the output of the operational amplifier 1. The potential of the electrically conductive screening plate sp and of the electrically conductive additional screening plates $sp_1, \ldots, sp_{n+1}$ is essentially of a phase opposite to the phase of the potential of the electrically conductive plate p and of the electrically conductive additional plates $p_1, \ldots, p_n$.

In both last embodiments of the selfadjusting capacitive level switch of the invention (FIGS. 11 and 12) the output of the operational amplifier 1 in one of the negative feedbacks is connected to its inverting input through a resistor 31. On the one hand the positive feedback is performed as follows. The output of the operational amplifier 1 is grounded through the second and third resistor 21, 22 connected in series, the common terminal of which resistors is connected to the noninverting input of the operational amplifier 1. On the other hand the output of the operational amplifier 1 is connected through the fourth resistor 25, an adjustable resistor 251, both connected in series, and the first coil 252 to a common terminal X of the fifth and sixth resistor 24, 23. The second terminal of the resistors 24, 23 is connected to the noninverting input of the operational amplifier 1 and to the first terminal of the third capacitor 26, respectively. And finally, the output of the operational amplifier 1 is connected through the second capacitor 6 and the second coil 61, both connected in series, to the second terminal of the third capacitor 26 and to the electrically conductive screening plate sp. The second coil 61 is inductively coupled to the first coil 252, whereat the coils 252, 61 can be coils of a ferrite transformer tr.

The opposite plate op is connected to the electrical network ground ec and, through the second RC-filter 11 consisting of a series connection of a resistor 113 and a resistor 111 and capacitor 112 connected parallelly to each other, to level switch mass.

At the sensor S5; S6 the opposite plate op and the screening plate sp are mounted either both on the surface of the dielectric body db (FIGS. 11, 12) or the opposite plate op is mounted on the surface of the dielectric body db and the screening plate sp is mounted in the dielectric body db or both the opposite plate op and the screening plate sp are mounted in the dielectric body db.

Leads connecting the groups of plates $p, p_1 \ldots, p_n$ to the resistors 321, 322, 323 provided for determining the effect exerted by the relevant plate group on the rate of changing the voltage on the inverting input of the operational amplifier, are mainly in a region around the opposite plate op enclosed in a guard shield gs being connected to the screening plate sp.

In the sensors S5; S6 electrically conductive plates $p_1, \ldots, p_n$ and $sp_1, \ldots, sp_{n+1}$ are placed in the dielectric several millimeters under the surface of the dielectric body db and parallelly hereto. Since the sensors S5; S6 of the selfadjusting capacitive level switch of the invention are also able to sense the region therearound through electrically conductive sticking layers sl thereon, they may be, e.g. for an application in a highly corroding medium like hydrochloric acid, enclosed or surface coated by a chemically resistant and, in order to save the electric contact of plates op, sp to the medium, electrically conductive coat, made e.g. of ruthenium dioxide or ruthenate, which is used in the production of electronic circuits.

In all embodiments of the selfadjusting capacitive level switch of the invention also a self-checking circuit is comprised, which in a self-acting manner performs an automatic control of the correct operation of the level switch. The self-checking circuit as a part of the selfadjusting capacitive level switch, e.g. in the second embodiment, is represented in FIG. 11. In the sensor S5 close to the plate p, e.g. close to the inner surface of the cylindrical plate p, an electrically conductive auxiliary plate ap is placed, its surface area amounting to about 1% of the surface area of the plate p. The auxiliary plate ap is connected to the first terminal of a switching circuit sc, i.e. to the drain of a field transistor T1 in the variant of the switching circuit sc presented in FIG. 11, and is grounded through a resistor R1. The source of the field transistor T1 represents the second terminal of the switching circuit sc and is connected to the output of the operational amplifier 1. The gate of the field transistor T1 is connected through a resistor R2 to the common terminal of a grounded resistor R3 and of the base of an unijunction transistor T2, the second base of which is connected to the voltage terminal Vcc and the emitter of which is connected on the one hand through a capacitor C1 to the voltage terminal Vdd and on the other hand through a resistor R4 to the second base of the transistor T2.

In the following the functioning of the selfadjusting capacitive level switch of the invention is represented. In FIG. 13 the sensor S6 of its third embodiment is shown. The sensor S6 is covered by the electrically conductive sticking layer csl consisting of the actually or previously controlled material. As a rule the sensor S6 is mounted on the metal wall mw with its tip directed slightly downwards. The opposite plate and the screening plate sp are situated on the surface of the dielectric body db of the sensor S6 and therefore therebetween and also between the screening plate sp and the metal wall mw an electric current j flows in the electrically conductive sticking layer csl. In the same way the electric current j starts flowing in the electrically conductive sticking layer csl towards the periphery regions of the dielectric body db surrounding the electrically conductive plate p and the first and further electrically conductive additional plate $p_1, p_2, \ldots$ so that in these periphery regions of the dielectric body db apparent screening plates sp', sp", ... appear and herefrom electric displacement currents flow towards the plates $p, p_1, p_2, \ldots$. The plates $p, p_1, \ldots$ on this side of the effectiveness border eb are thus paralysed and cannot participate in sensing the region round the sensor S6. On the other side of the effectiveness border eb, however, between the additional screening plates $sp_i$ and the additional plates $p_{i-1}$ and $p_i$, electric fields appear. In the electrically conductive surface layer csl they are compensated because of induced surface positive and negative electric charges, the field lines E, however, reach out of the sticking layer csl into the region surrounding the sensor S6. However, mutual capacitance of the plates $sp_i$ and $p_{i-1}, p_i$ naturally depends on the relative permittivity ∈ of the space crossed by the electric field lines E outside of the sticking layer csl, and the higher value of this capacitance is a sign for the medium presence round the coated sensor S6.

The number of the paralysed additional electrically conductive plates $p_i$, i.e. the number of the apparent plates sp', sp", .... of the sensor S6 coated by the electrically conductive layer or located in an electrically conductive medium is the higher and the effect of the screening plate sp is the stronger, the higher the electrical conductivity of the medium enclosing the sensor S6 is. At an experimental sensor S6 provided with six additional screening plates $sp_i$ and placed in a medium with specific electrical conductivity σ=10 S.cm/cm² all additional electrically conductive plates $p_i$ were screened and the sensor S6 could no more sense the region surrounding it. However, the second embodiment of the selfadjusting capacitive level switch provided with the sensor S5 comprising just one additional screening plate $sp_1$ is suitable to control the surface level of an electrically nonconductive medium.

When the surface level of the medium in the vessel is still distant from the sensor S6, the dielectric body db of the sensor S6 is enclosed in a static electric field extending in the region from the electrically conductive screening plate sp to the electrically conductive additional screening plate $sp_{n+1}$ placed at the very tip of the sensor S6 and with regard to the phase in which the oscillator has been stopped, e.g. originating from the screening plate sp and from additional screening plates $sp_i$ and terminating in the electrically conductive plate p and in the electrically conductive additional plates $p_1$. Because of numerous, e.g. n equals 5, and narrow, when looking in the longitudinal direction of the sensor S6, electrically conductive plates p, $p_i$, sp, $sp_i$, . . . ., the space se of effectiveness of this static electric field is limited in the radial direction to the space close to the sensor S6. If the medium approached the sensor S6 at right angle to its axis, the capacitive level switch of the invention would switch when the medium surface were already very close to the surface of the sensor S6; hence it would function as a non-contact level switch. However, since the sensor of level switches are usually mounted with a slightly downwards inclined tip, the sensor S6 of the capacitive level switch is already dipped in the medium when the switching occurs. The advantage of the level switch according to the invention with respect to hitherto known level switches exists in that its switching always happens within a narrow surface level interval regardless of the electrical properties of the controlled medium, i.e. in the narrow longitudinal interval of the sensor S6; for an electrically higher conductive medium it is enough that only the region of the sensor S6 next to its tip is partially immersed, for an electrically lower conductive medium, however, the region of several plates $sp_i$, $p_i$ from the tip of the sensor S6 upwards has to be partially immersed in order to enable the oscillator to start oscillating. The outermost electrically conductive plate at the tip of the sensors S5; S6 is the electrically conductive additional screening plate $sp_1$ and $sp_{n+1}$, respectively; namely, if the electrically conductive additional plate $p_n$ was placed at the tip of the sensor S6 in the electrically conductive medium, due to a too high capacitance between the last electrically conductive additional plate $p_n$ and the metal vessel walls mw, the oscillator would start oscillating already at the surface level below the tip of the sensor S6.

The oscillator part of the circuit of the selfadjusting capacitive level switch of the invention comprises the sensor S5; S6 and the negatively and positively feedbacked operational amplifier 1. The operational amplifier 1 is provided with three negative feedbacks: by the resistor 31; by the capacitive coupling of the electrically conductive screening plate sp and of the electrically conductive additional screening plates $sp_1$, . . . . $sp_{n+1}$ to the electrically conductive plate p and to the electrically conductive additional plates $p_1$ . . . . . $p_n$; and by the capacitive coupling of the electrically conductive plate p and of the electrically conductive additional plates $p_1$ . . . . . $p_n$ to the metal walls mw of the vessel. The operational amplifier 1 is also provided with two positive feedbacks: by the resistor 21; and through the resistor 24 from the point X in the level switch circuit. The oscillator frequency is determined by how much the tip of the sensor S5; S6 is dipped below the surface of the controlled medium, and according to the frequency-voltage characteristic of the operational amplifier 1 the oscillator output voltage is determined.

When the sticking layer csl of an electrically conductive medium is gathered on the sensor S6 (FIG. 13), in the layer csl a strong electric current i flows from the screening plate sp to the opposite plate op and to the metal wall mw of the vessel establishing a strong feedback from the point X through the resistor 24, while in the negative feedback the electric current between the plates $sp_i$ and $p_{i-1}$, $p_i$ is because of too low mutual capacitance of these plates too weak for, the oscillator to start oscillating. When such coated sensor S6 is immersed in a controlled medium with the relative permittivity $\epsilon$, the increase of the relative permittivity from 1 to $\epsilon$ in the space round the electrically conductive layer csl raises the mentioned capacitance to such an extent that the oscillator starts oscillating. The capacitive level switch of the invention is able to sense a medium with small relative permittivity surrounding its sensor although the sensor is coated by an electrically conductive sticking layer. Experiments with the selfadjusting capacitive level switch of the invention have shown that its sensor normally senses the surrounding space even if coated by a hydrochloric acid layer of a thickness of 0.2 mm to 0.5 ram; by the sensor enclosed by a paper envelope of the thickness of 1.5 mm and impregnated by water, the surface of a medium consisting of plastic balls of a thickness of 5 mm with a relative permittivity $\epsilon=1.5$ was detected; the sensor enclosed by a layer of dough of a thickness of 8 mm detected the surface of flour having a relative permittivity $\epsilon=2$.

When the level of the controlled electrically conductive medium is raised so that it partially encloses plates $sp_{n+1}$, $p_n$, $sp_n$ at the tip of the sensor S6, the negative feedback is fed from the output of the operational amplifier 1 on the one side through mass and then through capacitive coupling to the plates $p_n$, $p_{n-1}$ . . . . and on the other side through a capacitive coupling of the plates $sp_{n+1}$, $sp_n$, . . . . to mass and herefrom to the plates $p_n$, $p_{n-1}$ . . . . . Since the positive feedback from the point X and then through the resistor 24, is weak the oscillator starts oscillating already when several outermost plates $sp_{n+1}$, $p_n$, $sp_n$, . . . at the tip of the sensor S6 are immersed in the medium.

When the sensor S6 is dipped in an electrically nonconductive medium because of the relative permittivity $\epsilon$ of the medium the mutual capacitance of the plates $p_i$ and plates $sp_i$ is increased with respect to the mutual capacitance of these plates as long as the sensor S6 was enclosed by air. In order that the oscillator starts oscillating, the immersion of the sensor S6 in the medium must be such that besides the outermost group of the plates $p_n$, $p_{n-1}$ . . . . close to the tip of the sensor S6, which plates are interconnected and are connected to the inverting input of the operational amplifier 1 through the resistor 323, also at least a part of the second group of the plates $p_i$, which are interconnected and are connected to the inverting input of the operational amplifier 1 through the resistor 322, must be immersed. The resistance of the resistor 323 exceeds the resistance of the resistor 322 for several orders of magnitude. Therefore at such immersion of the sensor S6, the potential in the point X in the positive feedback loop is low enough for the oscillator to start oscillating. When thereafter the surface of the electrically nonconductive medium drops below the level of the tip of the sensor S6, it often happens that on the tip of the sensor S6 a lump of the electrically nonconductive medium left behind is accumulated. Above all, due to the high resistance of the resistor 323, the potential in the point X in the positive feedback loop is so high that the oscillator stops oscillating. By the resistors 321, 322, 323 the sensitivity of the sensor S6 in the regions around groups of the interconnected plates $p_i$ is adjusted.

By the adjustable resistor 251 the selfadjusting capacitive level switches of the invention provided with the sensor S5; S6 of diverse size and shape are adjusted to the same sensitivity of response with respect to whether they will be applied as an universal selfadjusting capacitive level switch to control the surface level of liquid, powdery or granular media. The sensor S5; S6 is matched to the oscillator circuit by the ferrite transformer tr, the resistors r1, 113 and the capacitor 26. Thereupon by the resistor 251 thereupon for the chosen ferrite transformer tr the positive feedback of the operational amplifier 1 is adjusted determining the desired behavior of an individual version of the capacitive level switch of the invention. By the circuit elements in the capacitive level switch of the invention the balance between the electric currents in negative and positive feedbacks is adjusted so that the oscillator starts oscillating as soon as a determined smallest amount of material appears close to the sensor S5; S6. By the described adjusting of the response the advantageous property of the selfadjusting capacitive level switch of the invention can be achieved that the turn on or the turn-off of the level switch due to the variation of the surface level of media having the most different electrical properties is always made within a narrow interval of the medium surface level.

The circuit of the capacitive level switch of the invention functions self-adjustingly when the controlled medium is changed. Here an important role is played by the ferrite transformer tr which makes possible a dynamic adjusting of the circuit to the situation on the sensor S5; S6 by influencing the voltage in the point X and thereby it the positive feedback. Naturally, however, the influence of the ferrite transformer tr on the positive feedback also depends on the adjustment of the resistor 251, which thereby again influences the oscillator frequency characteristic. in a selfadjusting manner there functions also the coupling from the point X through the capacitor 26 and resistor 23 to the electrically conductive plate screening plate sp on the sensor S5; S6, especially at electrically well conductive materials with the specific electrical conductivity σ between 1 mS.cm/cm$^2$ and 1 S.cm/cm$^2$.

A special problem is posed by an electrically highly conductive sticking layer csl with the specific electrical conductivity σ between 35 mS.cm/cm$^2$ and 1 S.cm/cm$^2$ on the sensor S5; S6. When the level switch circuit is adjusted so that it will be able to detect movements of an electrically nonconductive medium, the oscillator cannot be prevented from oscillating, though at a high frequency, already in the absence of the medium. Such a signal, however, is retained by the low frequency band filter 7 and cannot arrive to the output o of the level switch of the invention.

The resistances of the resistors 321, 322, 323 differ from each other; the resistance of the resistor 322, which is connected to the central group of the interconnected electrically conductive additional plates p$_i$ is several orders of magnitude below the resistances of the resistors 321 and 323, which two resistors thereby influence the potential in the point X of the oscillator positive feedback more strongly. Thus a sensitivity field of the sensor S6 is shaped. Thereat the region of the sensor S6 around electrically conductive additional plates p$_i$ which are connected to the resistor 322, is most sensitive to any variation of the surface level of the controlled medium. By an appropriate choice of the resistances of these resistors the ability of the sensor S6 to detect an electrically nonconductive medium through an electrically conductive sticking layer is enhanced. The electrically nonconductive medium in the present disclosure especially relates to low relative permittivity media.

By the choice of the resistance of the resistor r1 the ratio of the electric current flowing through the electrically conductive additional screening plates sp$_1$, . . . ,sp$_n$, sp$_{n+1}$ and the electric current flowing through the electrically conductive additional screening plate sp can be foreseen and thus the characteristic of the capacitive level switch of the invention additionally can be influenced.

The operational amplifier 1 is fed through the inputs Vcc, Vdd either continuously or intermittently with a frequency between 0.1 Hz and 100 Hz. The intermitting frequency is lower at smaller sensors S5; S6 and depends on the frequency region of the level switch operating frequency. The operational amplifier 1 is fed intermittently when a possibility of a postoscillation of the oscillator is expected in a situation existing round the sensor where an oscillation would not really be permitted. Thereby it is attained that the level switch turns on and off exactly and without hysteresis.

In the selfadjusting capacitive level switch of the invention an automatic checking of the correct operation of the level switch is performed in a self-acting manner. The unijunction transistor T2 in the switching circuit sc produces pulses with a width of about 2 milliseconds with a frequency of about 1 Hz. These pulses trigger the field transistor T1. When the field transistor T1 is open the auxiliary plate ap is at the potential of the output of the operational amplifier 1. Though this potential has a phase essentially opposite to the phase of the potential on the plate p, its influence is small and therefore does not disturb the functioning of the sensor S5. Each second, however, for a duration of 2 ms the auxiliary plate ap is connected through the resistor R1 to mass. If the sensor S5 is not enclosed by a medium then the oscillator of the level switch starts oscillating; at the output o of the capacitive level switch this is manifested as a controlling voltage pulse. However, if the sensor S5 is enclosed by a medium, the frequency and the oscillation amplitude of the oscillator are changed, which at the output o of the capacitive level switch is again manifested as a controlling voltage pulse. From the output o the current signal in a feeding-relais module (not shown) is conducted through an electronic circuit, which turns on a working relay to indicate a medium presence. The presence of the controlling pulses is checked on a resistor connected paralelly to a relay coil. By the inspection of the presence of checking pulses at the output o of the capacitive level switch there are astablished a mechanical damage of the sensor, a short circuit between the plates p and sp, a correct functioning of the electronic circuit of the capacitive level switch of the invention, a damage of the cable establishing a connection to the feeding-relay module and a correct functioning of the circuit for turning on the relay, of the relay coil and also of the automatic checking circuit. Allowed is a variation of the width and of the frequency of the checking pulses in the range ±50%. Because of the low frequency of the checking pulses the cable establishing connection to the feeding-relay module may be arbitrarily long.

It should still be mentioned that the self-acting automatic checking circuit in the known capacitive level switch of the firm Endress & Hauser is located in the feeding-relay module which across a two-wire cable feeds the circuit of the capacitive level switch and herefrom receives a measuring signal. The module also comprises a microprocessor which approximately once in a second switches the level switch from the measuring function to the controlling function. At the same time a response by an auxiliary capacitor within a measuring capacitor is measured and compared with a prescribed response stored in a module memory. This is an inspection whether the sensor and the connecting cable are mechanically undamaged and whether the electronic circuit on the sensor and the module itself function correctly.

The selfadjusting capacitive level switch of the invention in the second and third embodiment can be applied for an exact and reliable control of the surface level of an arbitrary medium, also a medium having relative permittivity close to 1, even with the sensor coated by an electrically conductive sticking layer.

We claim:

1. Self-adjusting capacitive level switch for non-contact or contact sensing of media or objects comprising a sensor (S1; S2; S3; S4), having a dielectric body (db), in one end of which a first electrically conductive plate (p) of a sensing capacitance is mounted and in the other end of which a second electrically conductive plate (op) acting as the opposing plate of the sensing capacitance, is mounted, a first electrically conductive screening plate (sp) being mounted in said body between the first electrically conductive plate (p) and the second electrically conductive plate (op), and an operational amplifier (1), which is provided with negative and positive feedback circuits, a inverting input of which is connected to a first electrically conductive plate (p) and the output of which is connected through a first capacitor (5) to a ground of said level switch, said amplifier being connected through a switching signal-shaping circuit to an output terminal of said level switch, wherein in the dielectric body (db) a third electrically conductive plate (op') acting as an additional opposing plate (op') and one or more additional electrically conductive screening plates (sp1, sp2, . . . ) are mounted one beside the other, in sequence, between the first screening plate (sp) and the first electrically conductive plate (p), the third electrically conductive plate (op') is connected through a first RC-filter (11) to the earth of the level switch, the second electrically conductive plate (op) is connected to an electrical network ground (ec), and the output of the operational amplifier (1) is connected through the second capacitor (6) to a common first terminal of first and further resistors (r, r1, . . . ) provided for shaping the electric field around the sensor (S1; S2; S3; S4) and the second terminal of the first resistor (r) for shaping the electric field is connected to the first screening plate (sp) and the second terminals of the further resistors (r1, r2, . . . ) for shaping the electric field are connected respectively to the additional screening plates (sp1, sp2, . . . ).

2. Level switch as recited in claim 1, characterized in that the third electrically conductive plate (op') is connected to the second electrically conductive plate (op).

3. Level switch as recited in claim 2, characterized in that the second electrically conductive plate (op) and the first screening plate (sp) are mounted at the surface of the dielectric body (db) of the sensor (S1).

4. Level switch as recited in claim 2, characterized in that the second electrically conductive plate (op) is mounted at the surface of the dielectric body (db) of the sensor (S2) and the first screening plate (sp) is mounted within the dielectric body (db) of the sensor (S2).

5. Level switch as recited in claim 2, characterized in that the second electrically conductive plate (op) and the first screening plate (sp) are mounted within the dielectric body (db) of the sensor (S3).

6. Level switch as recited in claim 2, characterized in that the operational amplifier (1) is energized intermittently with a frequency between 0.1 Hz and 100 Hz.

7. Level switch as recited in claim 2, characterized in that a lead connecting the first electrically conductive plate (p) to the inverting input of the operational amplifier (1) is enclosed in a guard shield (gs) being coupled to, and at a potential which is in phase with the potential at, the output of the operational amplifier (1).

8. Level switch as recited in claim 2, characterized in that the dielectric body (db) of the sensor (S1; S2; S3) is a prismatic body and the second plate (op), the screening plate (sp), the third plate (op'), the additional screening plates (sp1, sp2, . . . ) and the first plate (p) are annularly formed.

9. Level switch as recited in claim 2, characterized in that the dielectric body (db) of the, sensor (S4) is a flexible insulating foil and the second plate (op), the screening plate (sp), the third plate (op'), the additional screening plates (sp1, sp2, . . . ) and the first plate (p) are electrically conductive foils fastened thereon.

10. Level switch as recited in claim 2, characterized in that an auxiliary electrically conductive plate (ap), mounted close to the first plate (p), is connected at a frequency in the order of magnitude of 1 Hz for a time interval of 1 ms by a switching circuit (sc) alternately to the output of the operational amplifier (1) and to the earth of the level switch.

11. Self-adjusting capacitive level switch for non-contact or contact sensing of media or objects comprising a sensor (S5), having a dielectric body (db), in one end of which a first electrically conductive plate (p) of a sensing capacitance is mounted and in the other end a second electrically conductive plate (op) acting as the opposing plate of the sensing capacitance is mounted, a first electrically conductive screening plate (sp) being mounted between the first electrically conductive plate (p) and the second electrically conductive plate (op) and an operational amplifier (1), which is provided with negative and positive feedback circuits and a potential at an inverting input of said amplifier coupled to, and which is in phase with the potential at, the first electrically conductive plate (p) and the output of which is grounded through a first capacitor (5) and is connected through a switching signal-shaping circuit to an output terminal of said level switch, the potential of said first screening plate coupled to and following the potential at the output of said operational amplifier (1), wherein an additional electrically conductive screening plate ($sp_1$) is mounted in one end of the dielectric body (db) and the additional screening plate ($sp_1$) is connected through a first resistor (r1) to the first screening plate (sp).

12. Self-adjusting capacitive level switch for non-contact or contact sensing of media or objects comprising a sensor (S6), having a dielectric body (db) in which a first electrically conductive plate (p) of a sensing capacitance is mounted and in one end of the dielectric body (db) a second electrically conductive plate (op) acting as the opposing plate of the sensing capacitance is mounted, a first electrically conductive screening plate (sp) being mounted between the first and second electrically conductive plates (p, op), and an operational amplifier (1), which is provided with negative and positive feedback circuits and a potential at the inverting input of which is coupled to and in phase with a potential at the first electrically conductive plate (p) and the output of which is earthed through a first capacitor (5) and is connected through a switching signal-shaping circuit to an output terminal of said level switch, a potential of said first screening plate coupled to and following a potential at the output of said operational amplifier (1), wherein additional electrically conductive screening plates ($sp_1$, . . . , $sp_n$) and further electrically conductive plates ($p_1$, . . . , $p_n$) are positioned alternately in sequence along the dielectric body (db) between the first electrically conductive plate (p) and the other end of said dielectric body, and at the other end of the dielectric body (db) the last plate ($sp_{n+1}$) of said additional electrically conductive screening plates is mounted, the first electrically conductive plate (p) and several additional electrically conductive plates ($p_1$, . . . , $p_n$) proximate to each other are connected to each other in groups and these plate groups are connected through resistors (321, 322, 323), provided for determining an effect exerted by a relevant plate group on the rate of changing the voltage on the inverting input of the operational amplifier (1), to the inverting input of said amplifier and all additional electrically conductive screening plates ($sp_1, \ldots, sp_{n+1}$) are interconnected and are connected through a first resistor (r1) to the first electrically conductive screening plate (sp).

13. Level switch as recited in claim 12, characterized in that the resistance of one of the resistors (323), provided for the determination of the effect exerted by the group of additional plates ($p_i$) at the other end of the sensor (S6) on the rate of changing the voltage on the inverting input of the operational amplifier (1), exceeds for at least two orders of magnitude a second one of the resistors of the resistor (322) provided for determining the effect exerted by the adjacent group of additional plates ($p_i$) of the sensor (S6) on the rate of changing the voltage on the inverting input of the operational amplifier (1).

14. Level switch as recited in claim 13, characterized in that the output of the operational amplifier (1) is grounded through second and third resistors (21, 22) connected in series, the common terminal of which resistors is connected to the noninverting input of the operational amplifier (1), and the output of the operational amplifier (1) is connected through a fourth resistor (25), an adjustable resistor (251), and a first coil (252) to a common terminal of fifth and sixth resistors (24, 23), the second terminal of the fifth and sixth resistors is connected to the noninverting input of the operational amplifier (1) and to the first terminal of a third capacitor (26), respectively, and the output of the operational amplifier (1) is connected through a series connection of a second capacitor (6) and a second coil (61), which is within a ferrite transformer (tr) inductively coupled to the first coil (252), to the second terminal of the third capacitor (26) and to the first electrically conductive screening plate (sp).

15. Level switch as recited in claim 14, characterized in that an auxiliary electrically conductive plate ($p_1$), mounted near to the first plate (p), is connected at a frequency of 1 Hz for a time interval of 1 ms by a switching circuit (sc) alternately to the output of the operational amplifier (1) and to a ground of the level switch.

16. Level switch as recited in claim 14, characterized in that the second electrically conductive plate (op) is connected to an electrical network ground and through a first RC-filter (11) to the ground of the level switch.

17. Level switch as recited in claim 14, characterized in that the second plate (op) and the first screening plate (sp) are mounted on the surface of the dielectric body (db).

18. Level switch as recited in claim 14, characterized in that the second plate (op) is mounted on the surface of the dielectric body (db) and the first screening plate (sp) is mounted within the dielectric body (db).

19. Level switch as recited in claim 14, characterized in that the second plate (op) and the first screening plate (sp) are mounted within the dielectric body (db).

20. Level switch as recited in claim 14, characterized in that the sensor (S5; S6) is enclosed in an anti-corrosive electrically conductive layer.

21. Level switch as recited in claim 20, characterized in that the anti-corrosive electrically conductive layer is made of ruthenium dioxide or ruthenate.

22. Level switch as recited in claim 14, characterized in that the operational amplifier (1) is energized intermittently with a frequency between 0.1 Hz and 100 Hz.

23. Level switch as recited in claim 14, characterized in that leads connecting the first plate (p) and further plates ($p_1, \ldots, p_n$) to resistors (321, 322, 323) provided for determining the effect exerted by the relevant plate group on the rate of changing the voltage on the inverting input of the operational amplifier (1), are enclosed in a guard shield (gs) connected to the first screening plate (sp).

\* \* \* \* \*